United States Patent
Kishiro

(10) Patent No.: US 6,200,847 B1
(45) Date of Patent: *Mar. 13, 2001

(54) METHOD OF MANUFACTURING CAPACITOR OF SEMICONDUCTOR DEVICE

(75) Inventor: Koichi Kishiro, Tokyo (JP)

(73) Assignee: Oki Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/984,500

(22) Filed: Dec. 3, 1997

(30) Foreign Application Priority Data

Mar. 4, 1997 (JP) .................................. 9-048791

(51) Int. Cl.⁷ .................................. H01L 21/8242
(52) U.S. Cl. .................................. 438/240; 438/246
(58) Field of Search .................. 438/246, 239, 438/3, 393, 398, 250, 257, 240, 210, 785, 104, 778

(56) References Cited

U.S. PATENT DOCUMENTS

| | | | |
|---|---|---|---|
| 5,079,191 | * 1/1992 | Shinriki et al. | 438/235 |
| 5,508,221 | * 4/1996 | Kamiyama | 438/60 |
| 5,663,088 | * 9/1997 | Sandhu et al. | 438/396 |
| 5,726,083 | * 3/1998 | Takaishi | 438/210 |
| 5,837,593 | * 11/1998 | Park et al. | 438/396 |
| 5,851,841 | * 12/1998 | Ushikubo et al. | 437/60 |
| 6,010,927 | * 1/2000 | Jones, Jr. et al. | 438/210 |

OTHER PUBLICATIONS

Hiroshi Shinriki, "UV–O3 and Dry–)2: Two–Step Annealed Chemical Vapor–Deposited Ta2O5 Films for Storage Dielectrics of 64–Mb DRAMS's", IEEE Transactions on Electron Devices, vol. 38, No. 3, Mar. 1991, pgs. 455–462.

* cited by examiner

Primary Examiner—Matthew Smith
Assistant Examiner—Calvin Lee
(74) Attorney, Agent, or Firm—Jones Volentine, L.L.C.

(57) ABSTRACT

A method of manufacturing a capacitor of a semiconductor device, according to the present invention comprises the steps of heat-treating a $Ta_2O_5$ film formed on a metal or metal oxide electrode corresponding to a lower electrode of the capacitor at a temperature lower than a temperature at which the $Ta_2O_5$ film is crystallized, and thereafter heat-treating the $Ta_2O_5$ film at a temperature higher than or equal to the crystallizing temperature of the $Ta_2O_5$ film.

16 Claims, 4 Drawing Sheets

METHOD OF MANUFACTURING CAPACITOR OF SEMICONDUCTOR DEVICE

BACKGROUND OF THE INVENTION

1. Field of the Invention

This invention relates to a method of manufacturing a capacitor of a semiconductor device. The present invention relates particularly to a method of annealing a $Ta_2O_5$ film having a high relative dielectric constant, which is formed on a metal or metal oxide electrode.

2. Description of the Related Art

A relative dielectric constant of a $Ta_2O_5$ film formed on polycrystal silicon ranges from 20 to 28. This relative dielectric constant is three times or more than that of a silicon nitride film. Therefore, the introduction of the $Ta_2O_5$ film into a process has been studied with the $Ta_2O_5$ film as a DRAM (Dynamic Random Access Memory) capacitor dielectric of 256 Mbit or later.

It has recently been reported and noted that a $Ta_2O_5$ film formed on an electrode composed of a metal such as Pt, Ru or the like has indicated a relative dielectric constant close to 50.

A $Ta_2O_5$ film immediately after its deposition, which has been formed by CVD (Chemical Vapor Deposition), produces a large leakage current. A problem on such a leakage current characteristic can be improved by post anneal subsequent to the above formation.

This point of view will be described in detail. Many impurities caused by a raw gas are contained in the $Ta_2O_5$ film obtained immediately after its formation. Oxygen is also often deficient in the $Ta_2O_5$ film. These impurities and oxygen deficiencies are considered to serve as current paths and thereby result in a large leakage current flow.

Therefore, the $Ta_2O_5$ film is heat-treated at a high temperature near 800° C. in an atmosphere of oxygen or at a comparatively low temperature of 400° C. or less in an atmosphere of ozone or nitrogen oxide to reduce the impurities and oxygen deficiencies in the $Ta_2O_5$ film, whereby the leakage current can be greatly reduced.

However, if the $Ta_2O_5$ film deposited on the metal electrode is post-annealed at a temperature of 600° C. or less, it is then kept in an amorphous state. Thus, the relative dielectric constant thereof results in about 25 similar to the value of a $Ta_2O_5$ film on a silicon electrode and the leakage current is less than or equal to $10^{-8}$ $(A/cm^{-2})$.

On the other hand, when the $Ta_2O_5$ film on the metal electrode is heat-treated at a high temperature of 700° C. or more, the $Ta_2O_5$ film is crystallized so that its relative dielectric constant is increased to about 50. However, the leakage current is increased by one digit or more as compared with the $Ta_2O_5$ film kept in the amorphous state.

Therefore, the implementation of the $Ta_2O_5$ film on the metal electrode, which is indicative of the large relative dielectric constant of 50 or more, needs to decrease the leakage current in the crystallized $Ta_2O_5$ film.

SUMMARY OF THE INVENTION

With the foregoing in view, it is therefore an object of the present invention to provide a method of manufacturing a capacitor of a semiconductor device, which improves a method of annealing a $Ta_2O_5$ film formed on a metal or metal oxide electrode, thereby making it possible to crystallize a $Ta_2O_5$ film and limit a leakage current flow as low as possible.

According to one aspect of the present invention, for achieving the above object, there is provided a method of manufacturing a capacitor of a semiconductor device, comprising the following steps of:

a step for forming a metal or metal oxide electrode over a semiconductor substrate;

a step for forming a $Ta_2O_5$ film on the metal or metal oxide electrode;

a step for heat-treating the $Ta_2O_5$ film at a temperature lower than a crystallizing temperature of the $Ta_2O_5$ film to compensate for oxygen deficiencies and remove impurities; and a step for heat-treating the $Ta_2O_5$ film at a temperature higher than or equal to the crystallizing temperature of the $Ta_2O_5$ film after said heat-treating step to crystallize the $Ta_2O_5$ film.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

FIG. 1 is a cross-sectional view for explaining a method of manufacturing a capacitor of a semiconductor device, which illustrates a first embodiment of the present invention.

Figure 1A:
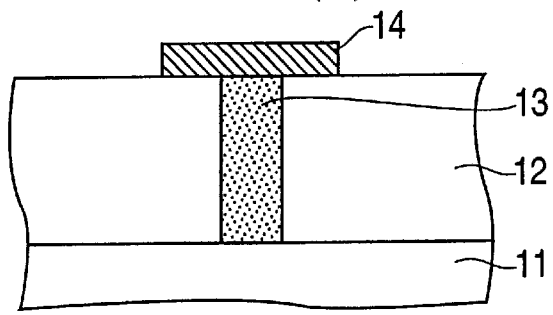
FIG. 1 is a cross-sectional view for describing a method of manufacturing a capacitor of a semiconductor device, which shows a first embodiment of the present invention.

As shown in FIG. 1(a), a contact hole is first defined in an interlayer insulator ($SiO_2$ film) 12 formed on a substrate 11. Polycrystal silicon 13 for contact is then embedded into the contact hole. A lower electrode 14 composed of a metal or metal oxide (such as Pt, Ru or RuO2, IrO2) is formed on the polycrystal silicon 13 and the interlayer insulator 12.

Figure 1B:
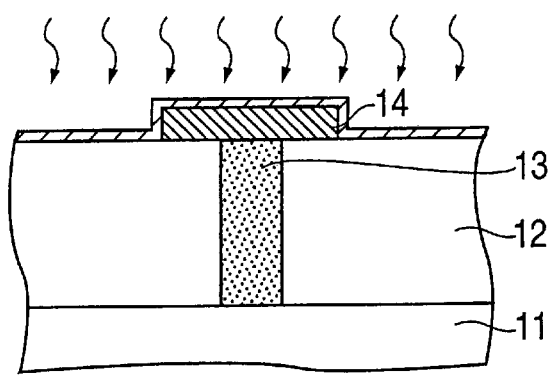

Next, a $Ta_2O_5$ film 15 is formed as shown in FIG. 1(b). Thereafter, the $Ta_2O_5$ film 15 is heat-treated at a temperature of about 600° C. lower than a crystallizing temperature of the $Ta_2O_5$ film for about an hour in an atmosphere of oxygen.

Figure 1C:
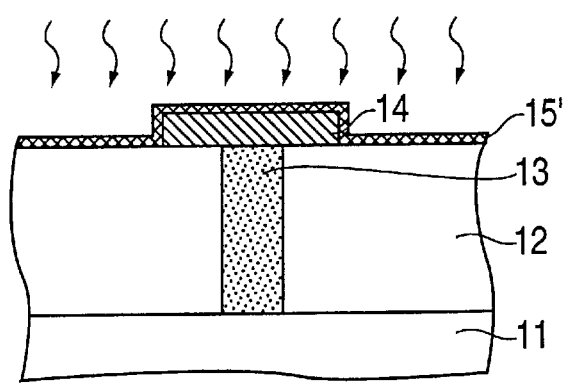

The $Ta_2O_5$ film 15 is then subjected to RTA (Rapid Thermal Annealing) at a temperature higher than or equal to the crystallizing temperature of the $Ta_2O_5$ film as shown in FIG. 1(c), so that a crystallized and high relative dielectric $Ta_2O_5$ film 15' is formed. In the present embodiment, the reaction other than the crystallization of the $Ta_2O_5$ film can be restrained by rapidly increasing the temperature for the $Ta_2O_5$ film to an intended temperature at 100° C./sec or above, using a lamp annealer, for example.

Figure 1D:
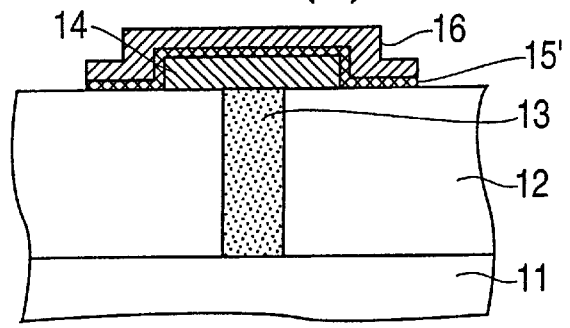

Finally, an upper electrode 16 is deposited on the crystallized $Ta_2O_5$ film 15' to form a capacitor cell as shown in FIG. 1(d).

In the first embodiment, the initial heat treatment of the $Ta_2O_5$ film is done at the temperature (of about 600° C.) lower than the crystallizing temperature of $Ta_2O_5$ film for about one hour in the atmosphere of oxygen. It is thus possible to sufficiently compensate for a oxygen deficiencies in the $Ta_2O_5$ film and remove impurities in the $Ta_2O_5$ film. Thereafter, the resultant product is subjected to RTA at a high temperature above 700° C. for about one minute so as to crystallize the $Ta_2O_5$ film. As a result, a large relative dielectric constant of the $Ta_2O_5$ film is obtained.

Thus, the $Ta_2O_5$ film having the high relative dielectric constant, which is able to restrict a leakage current flow, is formed on the metal or metal oxide electrode by crystallizing the $Ta_2O_5$ film after the cause of the leakage current has sufficiently been decreased by the initial low-temperature anneal.

FIG. 2 is a cross-sectional view for describing a method of manufacturing a capacitor of a semiconductor device, which illustrates a second embodiment of the present invention.

Figure 2A:
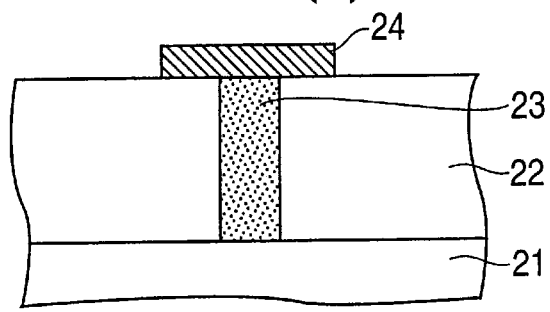
FIG. 2 is a cross-sectional view for describing a method of manufacturing a capacitor of a semiconductor device, which shows a second embodiment of the present invention.

An interlayer insulator ($SiO_2$ film) 22 is first formed on a semiconductor substrate 21 as shown in FIG. 2(a). A contact hole is then defined in the interlayer insulator 22. Polycrystal silicon 23 for contact is embedded into the contact hole. A lower electrode 24 composed of a metal or metal oxide (such as Pt, Ru or RuO2, IrO2) is formed on the polycrystal silicon 23 and the interlayer insulator 22.

Figure 2B:
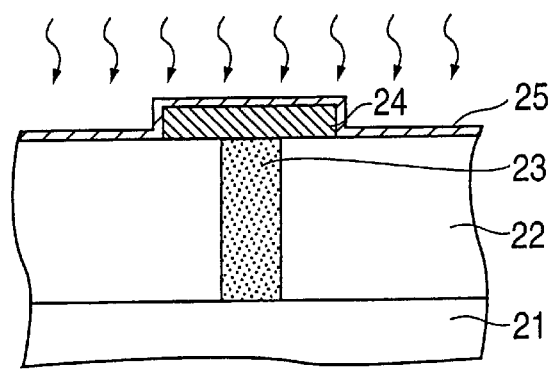

Next, a $Ta_2O_5$ film 25 is formed on the metal or metal oxide electrode as shown in FIG. 2(b). Thereafter, the $Ta_2O_5$ film 25 is heat-treated at a temperature of about 600° C. lower than a crystallizing temperature of the $Ta_2O_5$ film for about one hour in an atmosphere of oxygen.

Figure 2C:
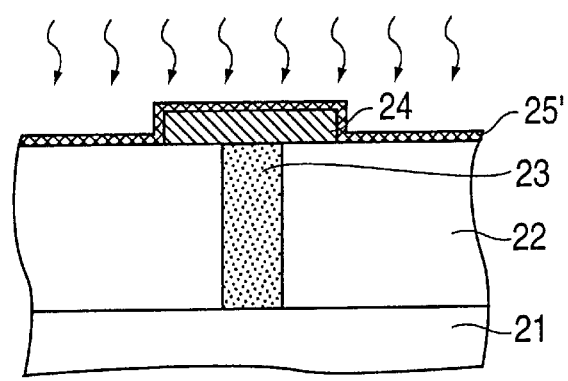

Next, the $Ta_2O_5$ film is subjected to heat treatment at a high temperature (700° C. or above) for crystallizing the $Ta_2O_5$ film, using a diffusion furnace as shown in FIG. 2(c). Described specifically, the temperature to be applied to the $Ta_2O_5$ film is increased to a target temperature at about 100° C./sec and the $Ta_2O_5$ film is subjected to heat treatment for about one hour. Thereafter, the so heat-treated $Ta_2O_5$ film is reduced in temperature at about 10° C./sec. As a result, a crystallized and high relative dielectric $Ta_2O_5$ film 25' is formed.

Figure 2D:
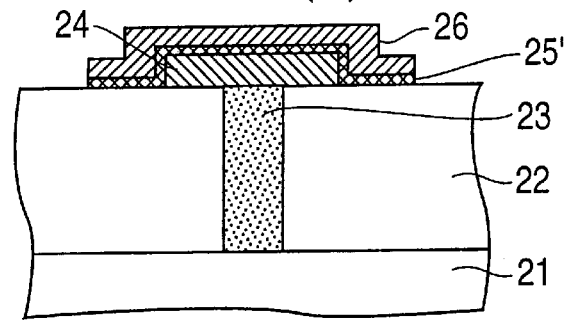

Finally, an upper electrode 26 is deposited on the crystallized $Ta_2O_5$ film 25' to form a capacitor cell as shown in FIG. 2(d).

In the second embodiment, the initial heat treatment of the $Ta_2O_5$ film is carried out at the temperature (about 600° C.) lower than the crystallizing temperature of $Ta_2O_5$ film for about one hour in the atmosphere of oxygen. It is thus possible to sufficiently compensate for oxygen deficiencies in the $Ta_2O_5$ film and remove impurities in the $Ta_2O_5$ film. Thereafter, a large crystal is grown by high-temperature heat treatment in the diffusion furnace, so that the $Ta_2O_5$ film with less crystal grain boundary is obtained in the $Ta_2O_5$ film.

Thus, the initial low-temperature anneal compensates for oxygen deficiencies in the $Ta_2O_5$ film and allows the removal of the impurities in the $Ta_2O_5$ film. A $Ta_2O_5$ film having a high relative dielectric constant, which further restricts a leakage current, can be formed on the metal or metal oxide electrode by reducing the crystal grain boundary at the crystallization of the $Ta_2O_5$ film with the subsequent anneal.

A third embodiment will next be described.

FIG. 3 is a cross-sectional view for describing a method of manufacturing a capacitor of a semiconductor device, which shows the third embodiment of the present invention.

The present embodiment is a two-step anneal method using a gas stronger than oxygen in oxidizing force.

Figure 3A:
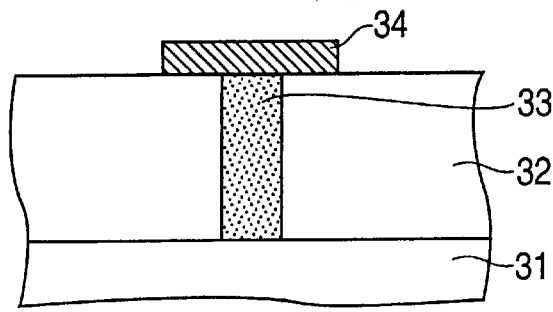
FIG. 3 is a cross-sectional view for describing a method of manufacturing a capacitor of a semiconductor device, which shows a third embodiment of the present invention.

An interlayer insulator ($SiO_2$ film) 32 is first formed on a semiconductor substrate 31 as shown in FIG. 3(a). A contact hole is defined in the interlayer insulator 32. Polycrystal silicon 33 for contact is embedded into the contact hole. A lower electrode 34 composed of a metal or metal oxide (such as Pt, Ru or RuO2, IrO2) is formed on the polycrystal silicon 33 and the interlayer insutator 32.

Figure 3B:
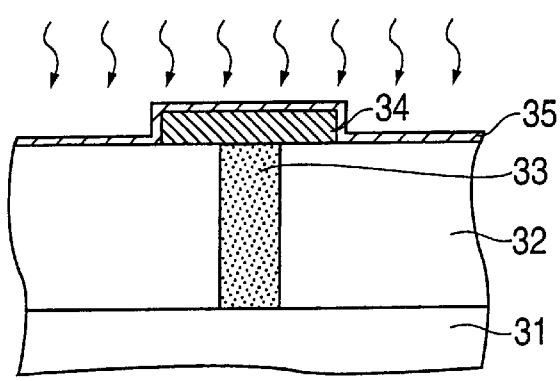

Next, a $Ta_2O_5$ film 35 is formed on the metal or metal oxide electrode as shown in FIG. 3(b). Thereafter, the $Ta_2O_5$ film 35 is heat-treated at a temperature of about 300° C. using $O_3$ or at a temperature of about 600° C. lower than a crystallizing temperature of the $Ta_2O_5$ film for about one hour in the atmosphere using $N_2O$ or the like, which is strong in oxidizing force.

Figure 3C:
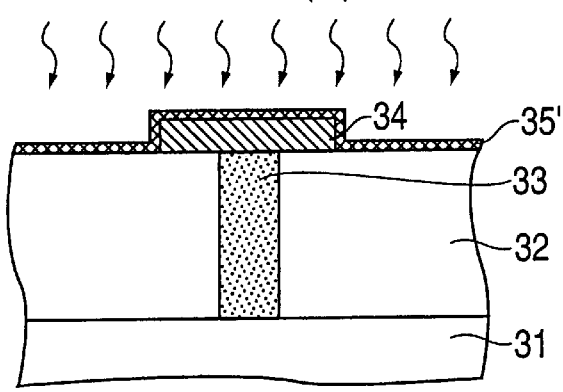

Next, the $Ta_2O_5$ film 35 is heat-treated at a high temperature (700° C. or more) for crystallizing the $Ta_2O_5$ film as shown in FIG. 3(c). As a result, a crystallized and high relative dielectric $Ta_2O_5$ film 35' is formed.

Figure 3D:
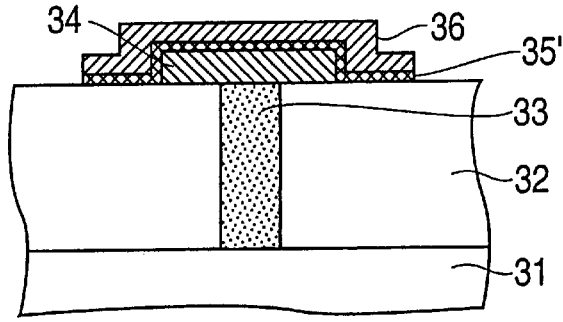

Finally, an upper electrode 36 is deposited on the $Ta_2O_5$ film 35' to form a capacitor cell as shown in FIG. 3(d).

Since the initial heat treatment of the $Ta_2O_5$ film is conducted in the atmosphere of $O_3$ strong in oxidizing force or the atmosphere of $N_2O$ or the like in the third embodiment, the compensation for the oxygen deficiencies in the $Ta_2O_5$ film is effectively carried out as compared with the first embodiment. Thereafter, the high-temperature heat treatment for crystallizing the $Ta_2O_5$ film is carried out. As a result, a $Ta_2O_5$ film having a high dielectric constant, which further limits a leakage current, can be formed on the metal or metal oxide electrode.

A fourth embodiment will next be described.

FIG. 4 is a cross-sectional view for describing a method of manufacturing a capacitor of a semiconductor device, which shows the fourth embodiment of the present invention.

The present embodiment is a two-step anneal method using an atmosphere under which the oxidizing force of oxygen is enhanced by light or plasma excitation.

Figure 4A:
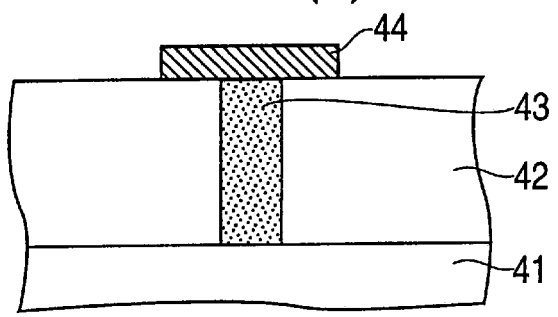
FIG. 4 is a cross-sectional view for describing a method of manufacturing a capacitor of a semiconductor device, which shows a fourth embodiment of the present invention.

An interlayer insulator ($SiO_2$ film) 42 is first formed on a semiconductor substrate 41 as shown in FIG. 4(a). A contact hole is defined in the interlayer insulator 42. Polycrystal silicon 43 for contact is embedded into the contact hole. A lower electrode 44 composed of a metal or metal oxide (Pt, RU or RuO2, IrO2) is formed on the polycrystal silicon 43 and the interlayer insutator 42.

Figure 4B:
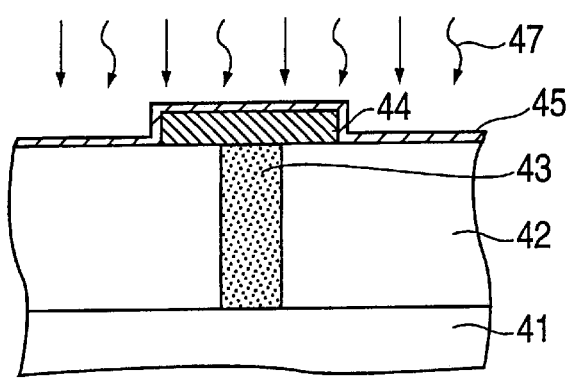
Figure 4C:
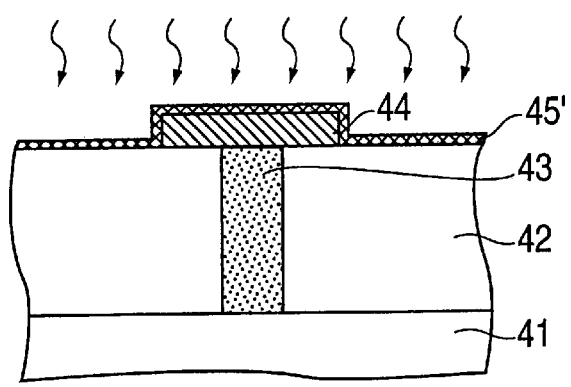

Next, a $Ta_2O_5$ film 45 is formed on the lower electrode 44 as shown in FIG. 4(b). Thereafter, the $Ta_2O_5$ film 45 is subjected to UV light 47 having a wavelength of about 200 nm for about one hour at a temperature below 670° C. lower than a temperature at which the $Ta_2O_5$ film is crystallized. Further, the so-processed $Ta_2O_5$ film 45 is heat-treated in an activated atmosphere of oxygen.

Next, the $Ta_2O_5$ film 45 is heat-treated at a high temperature (700° C. or more) for crystallizing the $Ta_2O_5$ film. As a result, a crystallized and high relative dielectric $Ta_2O_5$ film 45' is formed.

Figure 4D:
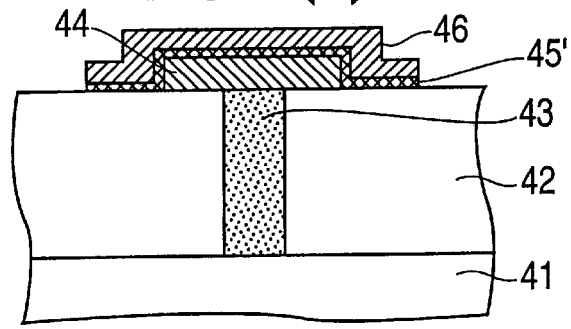

Finally, an upper electrode 46 is deposited on the crystallized $Ta_2O_5$ film 45' to form a capacitor cell as shown in FIG. 4(d).

In the fourth embodiment, since the initial heat treatment of the $Ta_2O_5$ film is performed in the oxygen atmosphere activated by the UV light or the like, the compensation for the oxygen deficiencies in the $Ta_2O_5$ film and the removal of impurities in the $Ta_2O_5$ film are effectively done as compared with the first embodiment. Thereafter, since the high-temperature heat treatment for crystallizing the $Ta_2O_5$ film is carried out, a $Ta_2O_5$ film having a high dielectric constant, which is capable of further limiting the flow of a leakage current, can be formed on the metal or metal oxide electrode.

According to the present invention, if a $Ta_2O_5$ film is of a lower electrode indicative of a larger relative dielectric constant due to its crystallization, then the same anneal method as described above is applicable to all metals or metal oxides as a method of reducing a leakage current developed in the $Ta_2O_5$ film.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a capacitor of a semiconductor device, comprising:

forming a metal or metal oxide electrode over a semiconductor substrate;

forming a $Ta_2O_5$ film on the metal or metal oxide electrode;

heat-treating the $Ta_2O_5$ film at a temperature lower than a crystallizing temperature of the $Ta_2O_5$ film to compensate for oxygen deficiencies and remove impurities; and heat-treating the $Ta_2O_5$ film having been subjected to said heat-treating at the temperature lower than the crystallizing temperature of the $Ta_2O_5$ film at a temperature higher than or equal to the crystallizing temperature of the $Ta_2O_5$ film after said heat-treating step to crystallize the $Ta_2O_5$ film.

2. A method according to claim 1, wherein said heat-treating the $Ta_2O_5$ film at the temperature lower than the crystallizing temperature of the $Ta_2O_5$ film is carried out in an oxidative atmosphere.

3. A method according to claim 2, wherein said heat-treating the $Ta_2O_5$ film at the temperature higher than or equal to the crystallizing temperature of the $Ta_2O_5$ film is a rapid heat-treating step.

4. A method according to claim 1, wherein said heat-treating the $Ta_2O_5$ film at the temperature higher than or equal to the crystallizing temperature of the $Ta_2O_5$ film is carried out through a diffusion furnace so as to obtain the $Ta_2O_5$ film having less crystal grain boundary.

5. A method according to claim 1, wherein said heat-treating the $Ta_2O_5$ film at the temperature lower than the crystallizing temperature of the $Ta_2O_5$ film is carried out in an atmosphere of $O_3$ or $N_2O$.

6. A method according to claim 1, wherein said heat-treating the $Ta_2O_5$ film at the temperature lower than the crystallizing temperature of the $Ta_2O_5$ film is carried out in an oxidative atmosphere activated by light or plasma excitation.

7. A method according to claim 1, wherein said heat treating at the temperature lower than the crystallizing temperature does not include rapid thermal annealing.

8. A method according to claim 1, wherein said heat treating at the temperature lower than the crystallizing temperature produces substantially no crystallization of the $Ta_2O_5$.

9. A method of manufacturing a capacitor of a semiconductor device, comprising:

forming a metal or metal oxide electrode over a semiconductor substrate;

forming a $Ta_2O_5$ film on the metal or metal oxide electrode;

heat-treating the $Ta_2O_5$ film at a temperature lower than a crystallizing temperature of the $Ta_2O_5$ film; and heat-treating the $Ta_2O_5$ film having been subjected to said heat-treating at the temperature lower than the crystallizing temperature of the $Ta_2O_5$ film at a temperature higher than or equal to the crystallizing temperature of the $Ta_2O_5$ film after said heat-treating step to crystallize the $Ta_2O_5$ film.

10. A method according to claim 9, wherein said heat-treating the $Ta_2O_5$ film at the temperature lower than the crystallizing temperature of the $Ta_2O_5$ film is carried out in an oxidative atmosphere.

11. A method according to claim 9, wherein said heat-treating the $Ta_2O_5$ film at the temperature higher than or equal to the crystallizing temperature of the $Ta_2O_5$ film is a rapid heat-treating step.

12. A method according to claim 9, wherein said heat-treating the $Ta_2O_5$ film at the temperature higher than or equal to the crystallizing temperature of the $Ta_2O_5$ film is carried out through a diffusion furnace so as to obtain the $Ta_2O_5$ film having less crystal grain boundary.

13. A method according to claim 9, wherein said heat-treating the $Ta_2O_5$ film at the temperature lower than the crystallizing temperature of the $Ta_2O_5$ film is carried out in an atmosphere of $O_3$ or $N_2O$.

14. A method according to claim 9, wherein said heat-treating the $Ta_2O_5$ film at the temperature lower than the crystallizing temperature of the $Ta_2O_5$ film is carried out in an oxidative atmosphere activated by light or plasma excitation.

15. A method according to claim 9, wherein said heat treating at the temperature lower than the crystallizing temperature does not include rapid thermal annealing.

16. A method according to claim 9, wherein said heat treating at the temperature lower than the crystallizing temperature produces substantially no crystallization of the $Ta_2O_5$ film.

* * * * *